United States Patent [19]
Tajima et al.

[11] Patent Number: 5,025,225
[45] Date of Patent: Jun. 18, 1991

[54] AMPLIFIER HAVING SUBSTANTIALLY CONSTANT D.C. TO R.F. CONVERSION EFFICIENCY

[75] Inventors: Yusuke Tajima, Acton; Robert G. Gels, Boston, both of Mass.

[73] Assignee: Raytheon Company, Lexington, Mass.

[21] Appl. No.: 452,165

[22] Filed: Dec. 15, 1989

[51] Int. Cl.⁵ .............................................. H03F 3/68
[52] U.S. Cl. .............................. 330/124 D; 330/124R
[58] Field of Search ............... 380/124 R, 124 D, 295; 333/100, 136, 137

[56] References Cited
U.S. PATENT DOCUMENTS
4,315,222 2/1982 Saleh .............................. 330/124 D Primary Examiner—James B. Mullins
Attorney, Agent, or Firm—Denis G. Maloney; Richard M. Sharkansky

[57] ABSTRACT

A power combiner which maintains substantially constant power combining efficiency with variable output power includes a set of unit amplifiers that are coupled by the power combiner. The power combiner includes a first plurality of a quarter wavelength transmission line sections coupled to the output of each unit amplifier. The second end of each one of the first plurality of quarter wavelength transmission line sections are successively coupled by a corresponding second plurality of quarter wavelength transmission line sections, with the succeeding or last one of said unit amplifiers having its quarter wavelength transmission line section coupled to an output terminal. The power combiner permits unit amplifiers in the amplifier module to be switched off in succession as less output power is required while maintaining substantially constant power combining efficiency, and hence substantially constant D.C. to r.f. conversion efficiency.

1 Claim, 1 Drawing Sheet

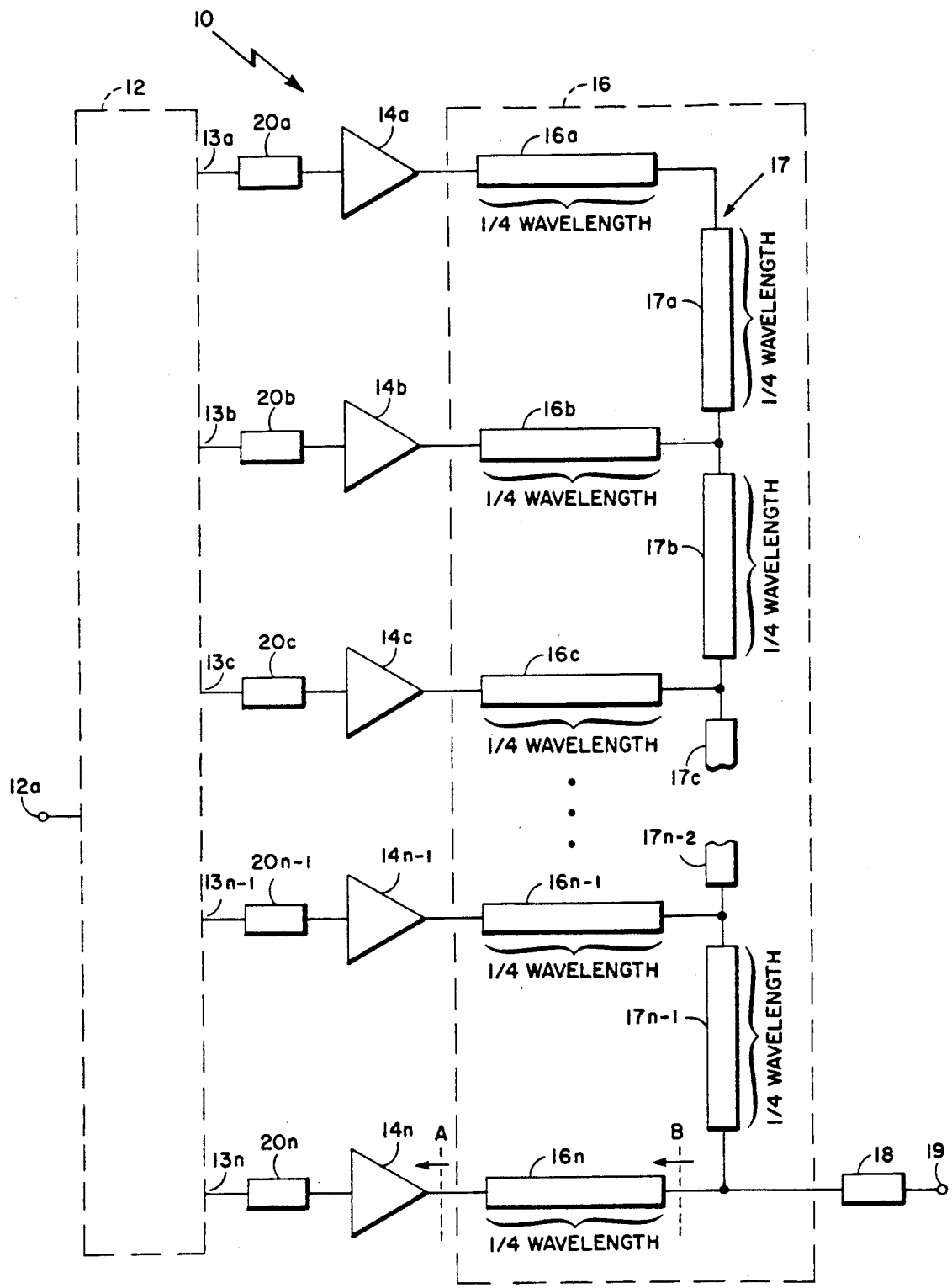

AMPLIFIER HAVING SUBSTANTIALLY CONSTANT D.C. TO R.F. CONVERSION EFFICIENCY

The Government has rights in this invention pursuant to Contract No. F30602-85-C-0122 awarded by the Department of the Air Force.

BACKGROUND OF THE INVENTION

This invention relates generally to microwave integrated circuits and more particularly to microwave power amplifiers.

As is known in the art, in sophisticated phased array antennas having a plurality of array elements, the output r.f. power of the array elements is often varied to maintain low side lobes. In many phased array radar systems, high power capabilities are required from the array. High power is provided to these array elements by using a circuit which combines the output power from several unit amplifiers.

It is often desired therefore to vary the output r.f. power from the array elements even when such elements include a plurality of unit amplifiers, combined together. While varying the output r.f. power of the array elements, it is nevertheless desirable to maintain a substantially constant D.C. to r.f. conversion efficiency for the amplifier. Most linear amplifiers such as, for example, a Class A amplifier, consume nearly the same amount of D.C. power regardless of the magnitude of the output signal provided from the amplifier. Therefore, when the output power from such amplifiers is reduced, the D.C. to r.f. conversion efficiency is reduced proportionally.

With conventional techniques using a plurality of amplifiers incorporating a conventional power combiner, the power combining efficiency of the power combiner is drastically reduced if one or more of the devices is turned off to reduce the output power of the overall amplifier. When such an arrangement is used in a large array, for example, a significant amount of D.C. power is wasted. Such a reduction in combining efficiency while trying to vary output r.f. power to maintain low side lobes results in a concomitant reduction in the D.C. to r.f. conversion efficiency of the overall amplifier. This arrangement is generally undesirable.

SUMMARY OF THE INVENTION

In accordance with the present invention, a high D.C. to r.f. conversion efficiency power amplifier includes a plurality of unit amplifiers, each having an input terminal fed by a input signal and an output terminal. The unit amplifiers have the output terminals thereof coupled by a power combiner. The power combiner includes a first corresponding plurality of quarter wavelength ($\lambda/4$) transmission line sections each having a first end coupled to the output of a corresponding one of the plurality of amplifiers. A second, different plurality of quarter wavelength ($\lambda/4$) transmission line sections are used to successively couple the second ends of each of the first plurality of ($\lambda/4$) transmission lines to an output of the power amplifier. Thus, a first one of said second plurality of quarter wavelength transmission lines has the first end thereof coupled to the second end of a first one of the first plurality of transmission lines. A succeeding one of said second plurality of transmission lines has the first end thereof coupled to a second end of the one of said corresponding plurality of first transmission lines preceding the last of such lines, and has a second end thereof coupled to the second end of the last one of said first plurality of transmission lines and to the output terminal of the network. With such an arrangement, by using circuit elements which having an electrical pathlength corresponding to a quarter wavelength at the operating frequency of the amplifier, when a unit amplifier is switched off it presents a short circuit or low impedance at the first end of the first plurality of amplifiers. However, the portion of the power combiner circuit connecting such unit amplifier has an electrical pathlength of a quarter wavelength. Thus, an impedance transformation is provided from the low impedance at the output of the amplifier to a high or near open circuit impedance at the other side of the transmission line. The ($\lambda/4$) transmission line section connected to the turned off amplifier is not significantly loaded by the switched off unit amplifier so that power combining efficiency of the power combiner is not significantly degraded. The impedance of the quarter wavelength elements in the successively connected transmission lines is designed so that the high efficiency is maintained as unit amplifiers are switched off.

BRIEF DESCRIPTION OF THE DRAWINGS

The foregoing features of this invention, as well as the invention itself, may be more fully understood from the following detailed description of the drawing, in which:

The FIGURE is a schematic representation of a plurality of unit amplifiers coupled by common output power combiner in accordance with the present invention.

DESCRIPTION OF THE PREFERRED EMBODIMENTS

Referring now to the FIGURE, a power amplifier 10 is shown to include an input voltage divider 12 having an input terminal 12a connected to an input port (IN) of the amplifier and a plurality of output ports 13a–13n, as shown. Input power divider 12 is fed an input signal at terminal 12a and provides here a corresponding plurality of equal amplitude in phase output signals along terminals 13a–13n. Signals from terminals 13a–13n are fed to one of a corresponding plurality of unit amplifiers 14a–14n, as shown. The signals from outputs 13a–13n are fed via transmission lines 20a–20n to the amplifiers 14a–14n, respectively. Each of such lines 20a–20n provide corresponding successively increasing electrical pathlength delays of 90° to such signals.

The outputs of unit amplifiers 14a–14n are coupled by here quarter wavelength $\lambda/4$ transmission line sections 16a–16n, as shown. A second, different plurality of quarter wavelength transmission line sections 17a–17n−1 are successively coupled between adjacent ones of the first plurality of transmission line sections 16a–16n, as shown. Thus, considering transmission line section 17b as an exemplary one of said transmission line sections, transmission line section 17b has a first end coupled to transmission line section 16b and a second end coupled to transmission line section 16c. Transmission line sections 17a–17m provide a successively connected or common transmission line 17. The last section 17n−1 of transmission line 17 is coupled to the common connection of transmission line section 16n and a transmission line section 18 to the output 19, as shown. Transmission line section 18 may have any electrical pathlength, and is used to connect the coupler 16 to the output terminal 19, as shown. All of the transmission lines described herein are microstrip transmission lines. However, other propagation media such as lumped element, or CPW (coplanar waveguide) may alternatively be used.

Here each one of the amplifiers 14a-14n, the so-called unit amplifiers, presents a short circuit impedance at the outputs thereof in response to the unit amplifiers being placed in an "off" state. Transmission line sections 16a14 16n each have an electrical pathlength corresponding to a quarter wavelength at the operating frequency of the power amplifier 10 and unit amplifiers 14a-14n. Such transmission lines are used to interconnect the unit amplifiers 14a-14n to the common transmission line 17, here shown as being comprised of individual transmission line sections 17a-17m, each having electrical pathlengths equal to a quarter wavelength at the operating frequency of the amplifier. Since the output signal of the amplifiers add in phase at the output of the circuit, the signal outputs of the unit amplifiers are successively 90° out of phase with each other at the operating frequency of the amplifier. This arrangement is provided as shown in the FIGURE by placing transmission line sections 20a-20n of the appropriate phase delay at the inputs of the amplifier between the power divider and amplifier, as shown. Each section would have an electrical pathlength corresponding to a successively increasing multiple of 90°, as described.

When the unit amplifier 14n, as shown in the FIGURE, is switched off, it remains switched off in such a manner that its input impedance remains nearly the same while its output impedance goes to a low value substantially close to zero at least over the operating frequency band of the amplifier (a short circuit). Since the input impedance remains nearly the same, the input power divider operation does not change. The low output impedance of the "off" unit amplifiers allows the power combiner to continue to operate efficiently. When the unit amplifier is switched off, it presents a short or low impedance at the reference plane labelled "A" in the FIGURE. The power combiner circuit element 16n connecting the unit amplifier 14n to the main transmission line 17 has an electrical pathlength of a quarter wavelength, thus providing an impedance transformation from the low impedance at reference plane "A" to a higher impedance at reference plane "B". Ideally, this impedance of reference plane "B" is an infinite impedance. This impedance transformation prevents the off unit amplifier from loading the common transmission line 17. Thus, the power combiner efficiency is not significantly altered by switching off one of the unit amplifiers. The impedance of the quarter wavelength like elements and the main transmission line is designed such that high efficiency is maintained as unit amplifiers are switched off in succession.

Thus, additional unit amplifiers such as amplifier 14n−1 could be switched off in a similar manner to achieve additional reductions of output power while maintaining high combining efficiency.

As reduced output power is desired, the best performance is achieved when the unit amplifier closest to the output of the combiner is switched off, then the unit amplifier adjacent to that one is switched off and so forth.

For a five unit amplifier combiner modeled with lossless lines, a Super Compact ® prediction of the power efficiency as successive unit amplifiers are switched off is given in the Table.

TABLE

| No. of Amplifiers on | Combining Efficiency |
| --- | --- |
| 5 | 100% |
| 4 | 96% |
| 3 | 97% |
| 2 | 87% |
| 1 | 82% |

These results show that combining efficiency of the overall amplifier module is little effected as the number of unit amplifiers is reduced to reduce the overall output power from the power amplifier.

Thus, such a power amplifier incorporating the power combining technique described may be used in applications where the amplifiers are required to produce a variety of different output powers while maintaining substantially constant D.C. to R.F. conversion efficiency. In particular, one application for such an arrangement will be in achieving amplitude tapering in a phased array antenna.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A high conversion efficiency power amplifier, comprising:

a plurality of amplifiers, each having an input fed by an input signal, and an output; and a power combiner comprising:

a corresponding plurality of quarter wavelength transmission lines, each having a first end coupled to the output of the corresponding one of said plurality of amplifiers; and a second, different plurality of quarter wavelength transmission lines, each having first and second ends, a first one of said second plurality of transmission lines having a first end thereof coupled to a second end of the first one of the first plurality of transmission lines, and the second end thereof coupled to the second end of the second one of the first plurality of transmission lines, and a succeeding one of said second plurality of transmission lines having a first end coupled to a preceding one of said first plurality of transmission lines and a second end coupled to succeeding one of said first plurality of transmission lines.

* * * * *